(12) United States Patent
Ebisui et al.

(10) Patent No.: US 9,570,407 B2
(45) Date of Patent: Feb. 14, 2017

(54) METHOD FOR MANUFACTURING SEMICONDUCTOR DEVICE AND SEMICONDUCTOR DEVICE

(71) Applicant: AOI Electronics Co., Ltd., Takamatsu-shi, Kagawa (JP)

(72) Inventors: Takahiro Ebisui, Takamatsu (JP); Masako Furuichi, Takamatsu (JP); Shuji Inoue, Ibaraki (JP)

(73) Assignee: AOI Electronics Co., Ltd., Takamatsu-shi (JP)

( * ) Notice: Subject to any disclaimer, the term of this patent is extended or adjusted under 35 U.S.C. 154(b) by 0 days.

(21) Appl. No.: 14/786,777

(22) PCT Filed: Mar. 28, 2014

(86) PCT No.: PCT/JP2014/059280
§ 371 (c)(1),
(2) Date: Oct. 23, 2015

(87) PCT Pub. No.: WO2014/174995
PCT Pub. Date: Oct. 30, 2014

(65) Prior Publication Data
US 2016/0086895 A1    Mar. 24, 2016

(30) Foreign Application Priority Data

Apr. 26, 2013    (JP) .................................. 2013-094349

(51) Int. Cl.
*H01L 23/48*    (2006.01)
*H01L 23/52*    (2006.01)
(Continued)

(52) U.S. Cl.
CPC ......... *H01L 23/562* (2013.01); *H01L 21/4875* (2013.01); *H01L 21/50* (2013.01);
(Continued)

(58) Field of Classification Search
USPC ....... 257/100, 433, 434, 667, 787–796, 685, 257/686, 772, 779, E23.015, 257/E23.02, E23.023–E23.079, 257/612–617, E21.508–E21.509, E21.519; 438/109, 612–617, 106, 107, 113, 458, 438/64, 611, 667
See application file for complete search history.

(56) References Cited

U.S. PATENT DOCUMENTS

2006/0108666 A1* 5/2006 Koizumi ............. H01L 23/3171
257/621
2010/0244171 A1* 9/2010 Nagamatsu ....... H01L 27/14623
257/433
2013/0313697 A1* 11/2013 Sato ................... H01L 23/3677
257/690

FOREIGN PATENT DOCUMENTS

JP    4-148553 A    5/1992
JP    11-307664 A    11/1999
(Continued)

OTHER PUBLICATIONS

International Search Report issued in counterpart PCT Application No. PCT/JP2014/059280 dated Jun. 24, 2014 with English-language translation (two (2) pages).

*Primary Examiner* — Tram H Nguyen
(74) *Attorney, Agent, or Firm* — Crowell & Moring LLP

(57) ABSTRACT

A method for manufacturing a semiconductor device includes: a fixing step in which semiconductor chips are mounted on and fixed to predetermined positions on an upper surface of a single starting substrate to form individual substrates; a connection step in which electrodes of the semiconductor chips and of the starting substrate are connected by wires; a sealing step in which on the upper surface of the starting substrate, the resin is potted among the semiconductor chips to seal an entire lateral circumference (Continued)

of each of the semiconductor chip; a bonding step in which a single starting protective cover to form individual protective covers is bonded to a surface of the resin so as to extend the semiconductor chips; and a cutting step in which an assembly of the semiconductor devices formed by bonding the starting protective cover to the starting substrate via the resin is cut to the semiconductor devices.

6 Claims, 16 Drawing Sheets

(51) Int. Cl.
| | | |
|---|---|---|
| *H01L 23/00* | (2006.01) | |
| *H01L 23/10* | (2006.01) | |
| *H01L 23/31* | (2006.01) | |
| *H01L 21/50* | (2006.01) | |
| *H01L 21/56* | (2006.01) | |
| *H01L 21/48* | (2006.01) | |
| *H01L 21/52* | (2006.01) | |
| *H01L 21/78* | (2006.01) | |
| *H01L 23/29* | (2006.01) | |
| *H01L 23/498* | (2006.01) | |

(52) U.S. Cl.
CPC .............. *H01L 21/52* (2013.01); *H01L 21/56* (2013.01); *H01L 21/561* (2013.01); *H01L 21/78* (2013.01); *H01L 23/10* (2013.01); *H01L 23/29* (2013.01); *H01L 23/3185* (2013.01); *H01L 23/49811* (2013.01); *H01L 24/97* (2013.01); *H01L 2224/48091* (2013.01); *H01L 2224/48227* (2013.01); *H01L 2224/48465* (2013.01); *H01L 2224/8592* (2013.01); *H01L 2924/12041* (2013.01); *H01L 2924/16151* (2013.01); *H01L 2924/16195* (2013.01)

(56) References Cited

FOREIGN PATENT DOCUMENTS

| | | | | |
|---|---|---|---|---|
| JP | 2004-95595 | A | 3/2004 | |
| JP | 2007035579 | * | 3/2004 | |
| JP | 2007-35779 | A | 2/2007 | |
| JP | 2007035779 | * | 2/2007 | ............. H01L 23/02 |
| JP | 2008-103460 | A | 5/2008 | |
| JP | 2010-187182 | A | 8/2010 | |
| JP | 2011-126943 | A | 6/2011 | |
| JP | 2013-94349 | A | 5/2013 | |

* cited by examiner

EMBODIMENT 1

EMBODIMENT 1

EMBODIMENT 2

EMBODIMENT 4

EMBODIMENT 4

EMBODIMENT 5

EMBODIMENT 6

FIG.12 EMBODIMENT 6

EMBODIMENT 7

FIG.15
EMBODIMENT 9
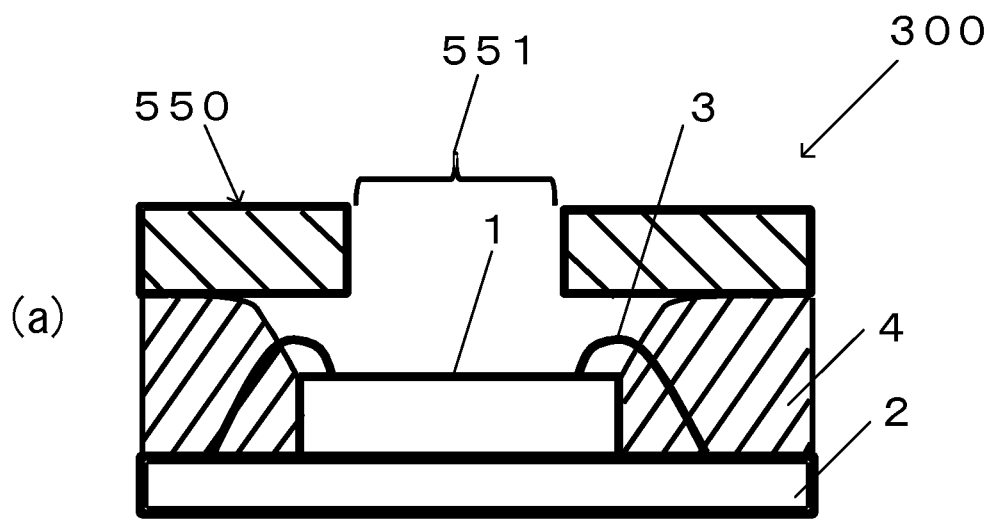
(a)
EMBODIMENT 10
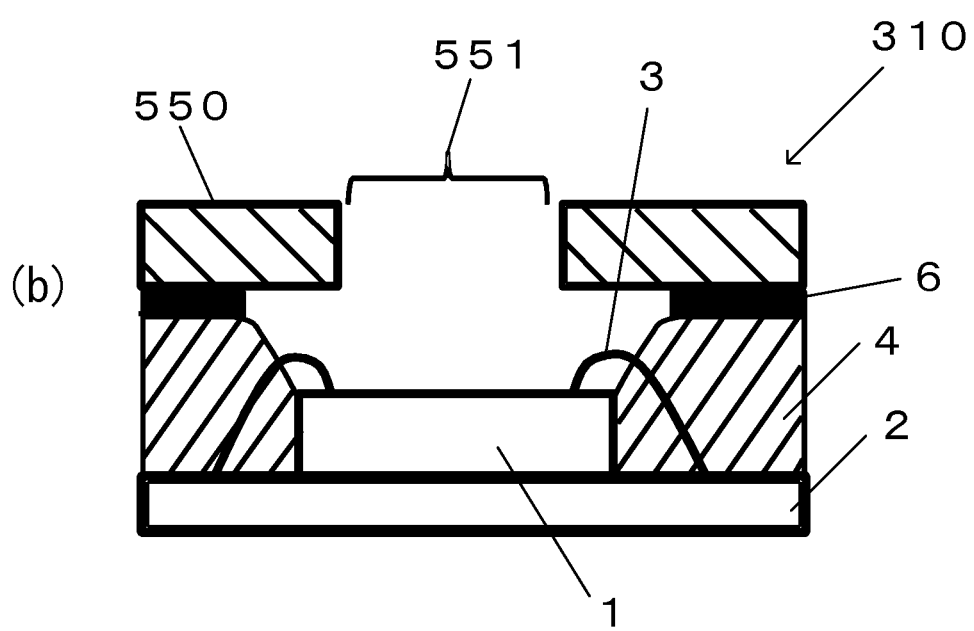
(b)

EMBODIMENT 11

METHOD FOR MANUFACTURING SEMICONDUCTOR DEVICE AND SEMICONDUCTOR DEVICE

TECHNICAL FIELD

The present invention relates to a method for manufacturing a semiconductor device and a semiconductor device.

BACKGROUND ART

Conventional methods for manufacturing an electronic package component by sealing a semiconductor element in a material, for instance, ceramic to form a hollow construction include a method that involves preparing a substrate having a plurality of concave portions, placing a semiconductor element in each of the concave portions, sealing the respective concave portions with a plate-like sealing member over the entire substrate, and cutting the resultant structure at portions in between any two adjacent concave portions to manufacture individual semiconductor devices (see, for instance, PTL 1).

Also, a method for manufacturing a semiconductor device by mounting semiconductor elements on a flat plate-like substrate and sealing them with a lid member having formed concave portions to produce semiconductor devices with respective hollow constructions (see, for instance, PTL 2).

CITATION LIST

Patent Literature

PTL1: JP H11-307664
PTL2: JP H4-148553

SUMMARY OF INVENTION

Technical Problem

Forming concave portions at a substrate or a lid member for semiconductor devices as in the conventional technology is more expensive than using a flat plate-like substrate. In addition, a mound which the lid member for sealing sticks to is necessary, making the final semiconductor device larger.

Solution to Problem

According to the 1st aspect of the present invention, a method for manufacturing a semiconductor device including a substrate; a semiconductor chip mounted on the substrate having a functional element; a resin that seals a circumference of the semiconductor chip; and a flat plate-like protective cover bonded to an upper surface of the resin, comprises: a fixing step in which a plurality of semiconductor chips each corresponding to the semiconductor chip in the semiconductor device are mounted on and fixed to predetermined positions on an upper surface of a single starting substrate that is to form individual pieces each corresponding to the substrate in the semiconductor device; a connection step in which electrodes of the plurality of semiconductor chips and corresponding electrodes of the starting substrate are connected by wires, respectively; a sealing step in which on the upper surface of the starting substrate, the resin is provided by potting among the plurality of semiconductor chips to seal the semiconductor chips with the resin over an entire lateral circumference of each of the semiconductor chip; a bonding step in which a single starting protective cover that is to form individual pieces each corresponding to the protective cover is bonded to a surface of the resin so as to extend over the plurality of semiconductor chips; and a cutting step in which an assembly of the semiconductor devices formed by bonding the starting protective cover to the starting substrate via the resin is cut to pieces each corresponding to the semiconductor device, wherein in the bonding step, the starting protective cover is bonded to the upper surface of the resin that seals the entire lateral circumference of each semiconductor chip so that a space in which each of the wires is partially exposed is formed between an upper surface of each semiconductor chip and an inner surface of the starting protective cover.

According to the 2nd aspect of the present invention, it is preferred that in the method for manufacturing a semiconductor device according to the 1st aspect, the resin is provided by potting around each semiconductor chip to a height higher than a height of a highest position of the wires in the sealing step; the bonding step includes a pressing step in which the starting protective cover is pressed against the upper surface of the resin that is in an uncured state or in a semi-cured state; and a sum of a thickness of the starting protective cover and a thickness of the resin that is cured is made larger than a distance from the upper surface of the starting substrate to the highest position of the wire.

According to the 3rd aspect of the present invention, it is preferred that in the method for manufacturing a semiconductor device according to the 1st aspect, the resin is provided by potting to a height larger than the height of the highest position of the wires around each semiconductor chip in the sealing step; and the method comprises a curing step to cure the resin, and a coating step in which an adhesive is coated on the surface of the cured resin; wherein in the bonding process, the starting protective cover is bonded to the surface of the resin with an adhesive.

According to the 4th aspect of the present invention, it is preferred that in the method for manufacturing a semiconductor device according to the 1st aspect, the resin is provided by potting to a height larger than the height of the highest position of the wires around each semiconductor chip in the sealing step; and the bonding step in the method comprises: a coating step in which a resin layer that is to form individual pieces each corresponding to the protective cover is coated on a support sheet; a pressing step in which the support sheet is pressed against an upper surface of the resin in a semi-cured state or in an uncured state via the resin layer; and a peeling/forming step in which after the resin layer and the resin are cured, the support sheet is peeled off and a resin layer that is to form individual pieces each corresponding to the protective cover is bonded to an upper surface of the resin from which the support sheet is peeled off, wherein a sum of a thickness of the resin layer and a thickness of the resin after the peeling/forming step is made larger than a distance from an upper surface of the starting substrate to a highest position of the wire.

According to the 5th aspect of the present invention, it is preferred that in the method for manufacturing a semiconductor device according to the 1st aspect, the resin is provided by potting around each semiconductor chip to a height of the substantially upper surface of the semiconductor chip in the sealing step; the starting protective cover has an opening large enough to surround the wires connected to the electrodes of the starting substrate, and a sum of a thickness of the starting protective cover and a thickness of the resin is made larger than a distance from the upper surface of the starting substrate to a highest position of the wires; and the starting protective cover is pressed against the resin while the resin is in an uncured state or in a semi-cured state to bond the starting protective cover to the resin.

According to the 6th aspect of the present invention, it is preferred that in the method for manufacturing a semiconductor device according to the 1st aspect, the resin is provided by potting around each semiconductor chip to a height of the substantially upper surface of the semiconductor chip in the sealing step; the starting protective cover has an opening large enough to surround the wires connected to the electrodes of the starting substrate, and a sum of a thickness of the starting protective cover and a thickness of the resin is made larger than a distance from the upper surface of the starting substrate to a highest position of the wires; and the starting protective cover is bonded to the cured resin with an adhesive.

According to the 7th aspect of the present invention, a semiconductor device comprises: a substrate; a semiconductor chip that has a functional element and is mounted on the substrate, with electrodes of the functional element and corresponding electrodes of the substrate being connected to each other by wires, respectively; a resin that is provided around the semiconductor chip to a position higher than height of a highest position of the wires to seal semiconductor chip; and a flat plate-like protective cover bonded to a surface of the resin, wherein the protective cover is bonded to an upper surface of the resin that seals an entire circumference of the semiconductor chip so as to form a space in which the wires are partially exposed between the upper surface of the semiconductor chip and an inner surface of the protective cover.

Advantageous Effects of Invention

According to the present invention, semiconductor devices with respective hollow constructions can be manufactured without using any substrate or lid member that is provided with concave portions in the semiconductor devices. In addition, no mound for sticking the lid member is necessary, which makes the semiconductor device smaller.

BRIEF DESCRIPTION OF DRAWINGS

FIG. 15 (*a*) is a cross-sectional view corresponding to the cross-section along the line VIII-VIII in FIG. 7, showing the semiconductor device according to Embodiment 9, and FIG. 15 (*b*) is a cross-sectional view corresponding to the cross-section along the line VIII-VIII of FIG. 7, showing a semiconductor device according to Embodiment 10 of the present invention.

DESCRIPTION OF EMBODIMENTS

With reference to FIGS. 1 to 16, embodiments of the semiconductor device and of the method for manufacturing the semiconductor device according to the present invention are explained.

Embodiment 1

Figure 1:
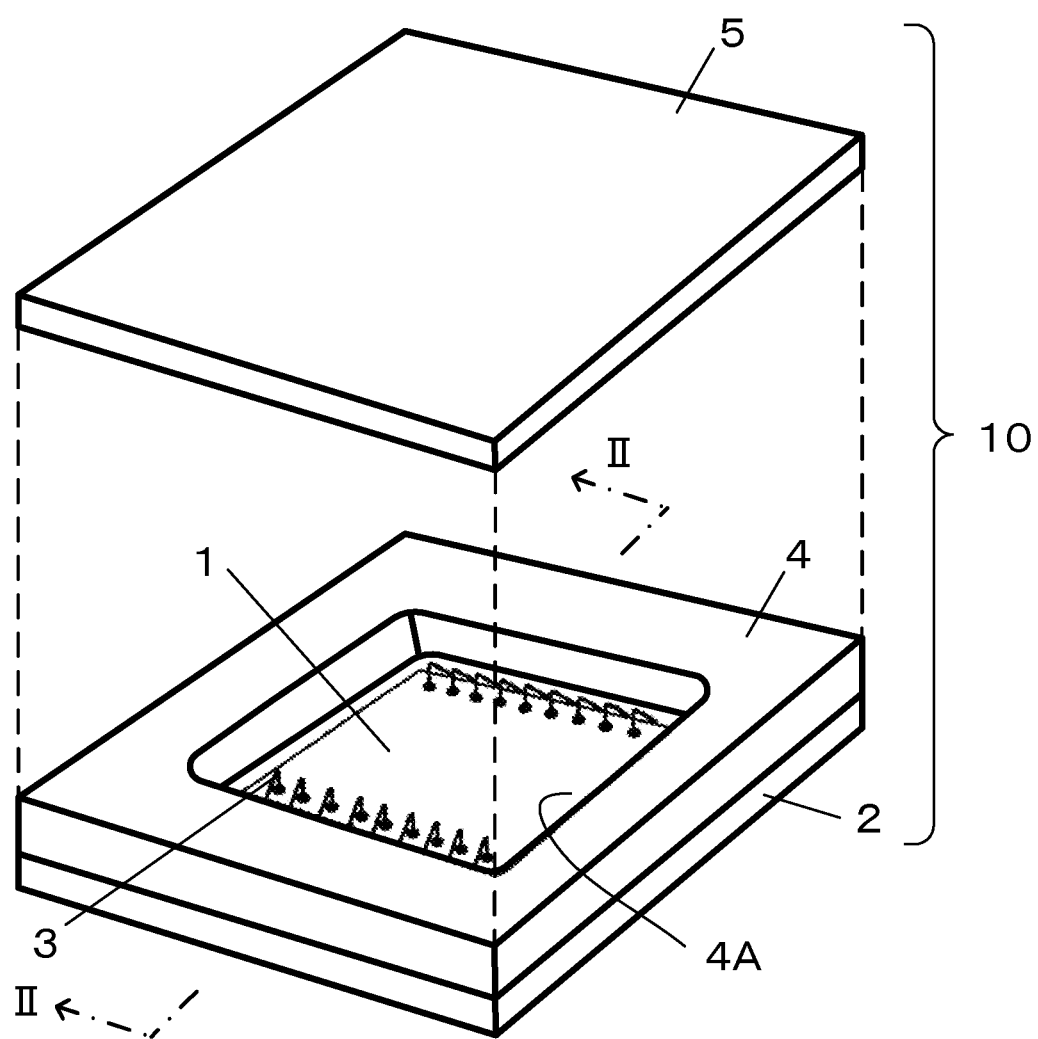
FIG. 1 is an exploded perspective view showing a semiconductor device according to Embodiment 1 of the present invention.
Figure 2:
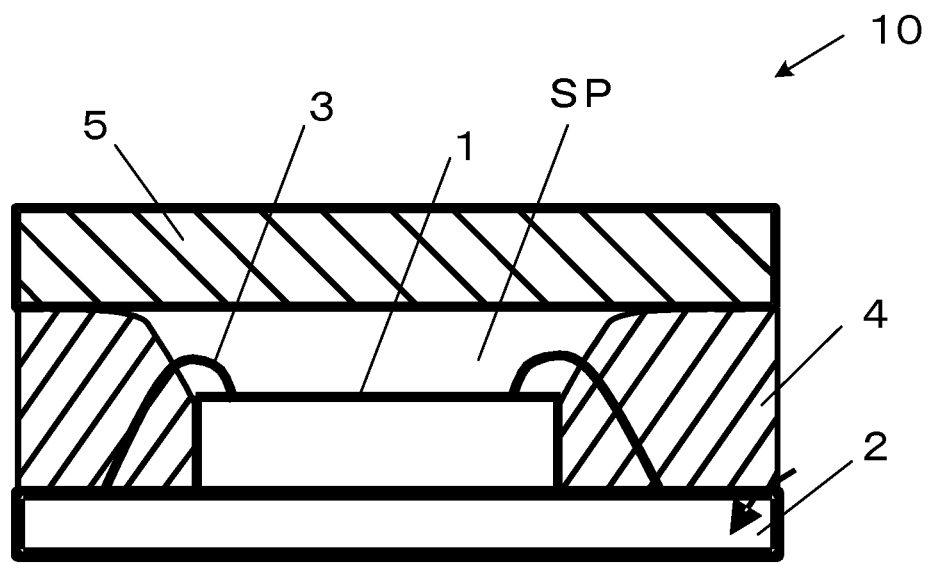
FIG. 2 is a cross-sectional view along the line II-II in FIG. 1.

FIG. 1 is an exploded perspective view showing a semiconductor device according to Embodiment 1 and FIG. 2 is a cross-sectional view along the line II-II in FIG. 1.

A semiconductor device 10 according to Embodiment 1 includes a semiconductor chip 1 installed on an upper surface of a substrate 2, a resin 4 that seals the circumference of the semiconductor chip 1 on the substrate 2, and a protective cover 5 that covers the sealing resin 4. The sealing resin 4 has an opening 4A. As can be seen form FIGS. 2 and 3, a marginal part of the opening 4A actually forms a smooth slope.

The semiconductor chip 1 is used in devices that need to be sealed, for instance, acceleration sensors and gyro sensors. The cover 5 is a sheet-like flat plate made of a resin. To the upper surface of the resin 4 that seals the entire lateral circumference of the semiconductor chip 1 is bonded a protective cover 5 so that a space SP, in which a wire 3 is partially exposed, can be formed between the upper surface of the semiconductor chip 1 and the inner surface of the protective cover 5.

Figure 3:
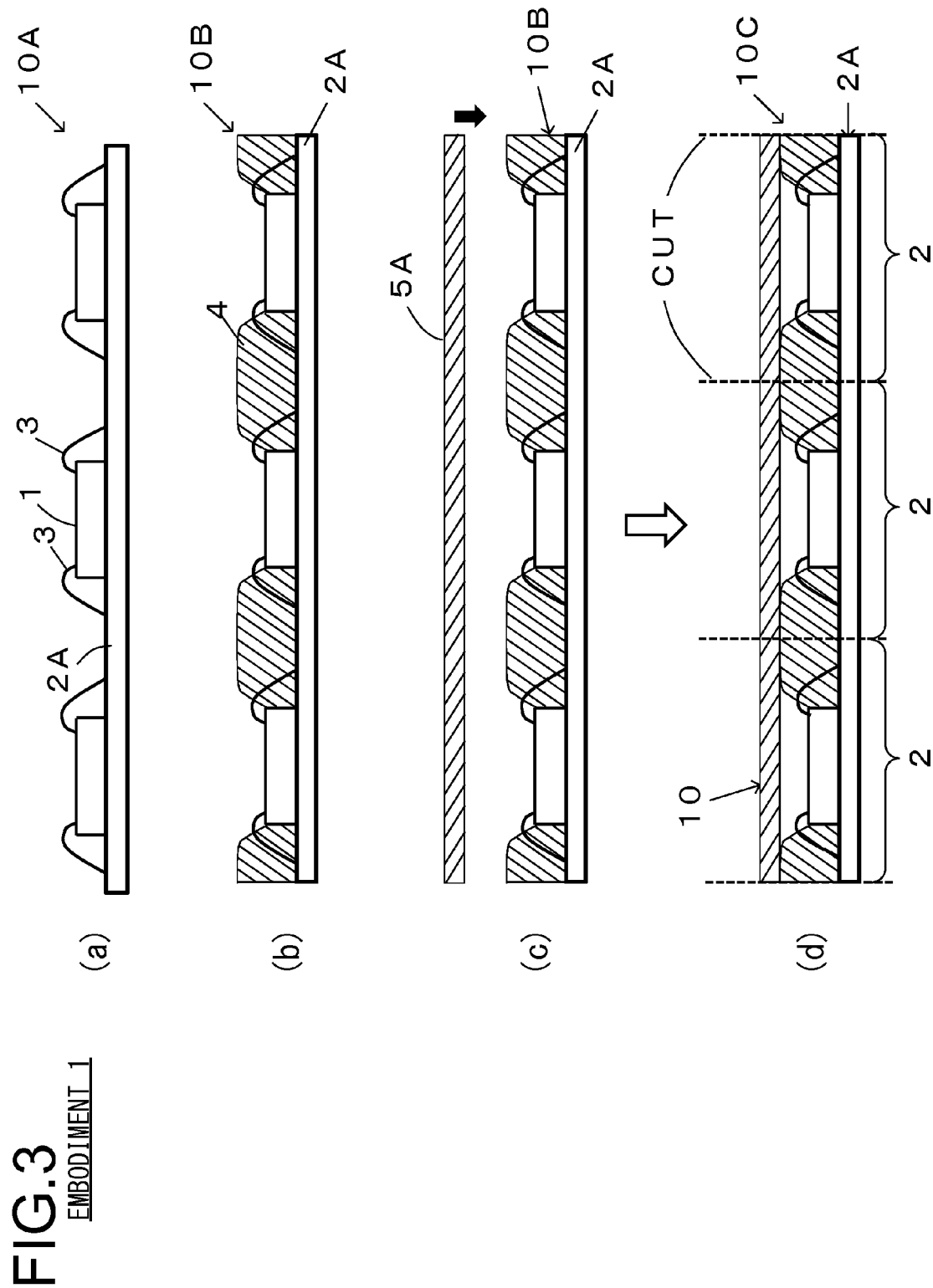
FIGS. 3(*a*) to (*d*) are diagrams illustrating Embodiment 1, which is a method for manufacturing the semiconductor device shown in FIG. 1.

FIGS. 3(*a*) to (*d*) are diagrams illustrating the method for manufacturing the semiconductor device 10 according to Embodiment 1 shown in FIG. 1.

(Preparing Step)

A plurality of semiconductor chips 1, a large starting substrate 2A, and a protective cover (starting protective cover) 5A made of an opaque resin are provided. The starting substrate 2A is an insulation substrate, on upper surface of which an electrode pattern or a wiring pattern is formed. The starting substrate 2A is fabricated by using, for instance, a glass-epoxy resin, ceramic, or a lead frame. As will be described later, the starting substrate 2A is cut to produce each substrate 2.

(Fixing Step)

A plurality of semiconductor chips 1 are arranged and fixed, i.e., installed at predetermined positions on an upper surface of the starting substrate 2A. Electrode pads on an upper surface of each semiconductor chip 1 are connected to corresponding electrode pads on the starting substrate 2A via respective bonding wires 3 (FIG. 3(a)). An interim product in FIG. 3 (a) is indicated with a reference sign 10A.

(Potting Step)

Between any two adjacent members of the semiconductor chips 1 in the interim product 10A shown in FIG. 3 (a) a thermosetting resin 4 that is flowable is provided by potting. The thermosetting resin 4 is potted to a height larger than the height of each semiconductor chip 1 and larger than the height of each bonding wire 3. The potted resin 4, due to its surface tension and viscosity, rises obliquely at the uppermost edge of the side of the semiconductor chip 1 to form a nearly trapezoid form in cross-section (see FIG. 3 (b)). The thermosetting resin 4 is a light-shielding opaque resin, such as epoxy resin.

(Semi-curing Step)

The potted thermosetting resin 4 is heated at a temperature equal to or higher than the curing-start temperature for a predetermined time to bring it into a semi-cured state. If the curing temperature of the resin 4 is 150° C., the resin 4 is heated at a heating temperature of about 100° C. to render it semi-cured. This interim product is indicated with a reference sign 10B in FIGS. 3(b) and (c). The term "semi-cured state" means a cured state of the resin 4 such that when the protective cover 5A is pressed against the resin 4 in the bonding step described later, the semi-cured resin 4 is tacky and deformable but is non-flowable.

(Bonding Step)

The resin 4 in the interim product 10B shown in FIGS. 3(b) and (c) is in a semi-cured state and the surface of the resin 4 is tacky. A sheet of protective cover 5A made of a resin is pressed onto the upper surface of the resin 4 (FIG. 3 (c)). The pressing force exerted on the cover 5A is set so that the semiconductor device 1 has a predetermined size in height. The pressing force depends on the viscosity of the resin in a semi-cured state. Thus, the heating temperature and heating time for rendering the resin semi-cured, that is, the heating temperature and heating time for obtaining predetermined viscosity of the resin may be determined as appropriate depending on the resin to be used.

(Curing Step)

The resin 4 is cured either with or without predetermined pressing force being exerted on the protective cover 5A. Reheating is performed at a temperature, for instance, not lower than 150° C. for a predetermined time. After the resin 4 is completely cured with the protective cover 5A being bonded to the resin 4, the single starting substrate 2A on which the plurality of semiconductor devices 10 arranged in the form of a matrix is cut into individual pieces to separate the semiconductor devices 10 (FIG. 3 (d)) to obtain the semiconductor device 10 shown in FIG. 1.

In FIGS. 3(a) to (d), three semiconductor chips 1 are shown to be installed on the starting substrate 2A. Actually, on the order of several tens to a thousand of semiconductor chips 1 are mounted in the form of a matrix on the starting substrate 2A. Accordingly, FIGS. 3(a) to (d) illustrate each by an example respective portions of the starting substrate 2A, the semiconductor chips 1 mounted on the starting substrate 2A, and the sheet-resin-made protective cover 5A. The same applies to the figures relating to respective embodiments described hereinbelow.

The semiconductor device 10 according to Embodiment 1 includes the substrate 2, the semiconductor chip 1 such as an acceleration sensor or a gyro sensor mounted on the substrate 2, the resin 4 that seals the circumference of the semiconductor chip 1, and the flat plate-like protective cover 5 bonded to the surface of the resin 4. The semiconductor device 10 is manufactured by the following manufacturing method. That is, the method includes a fixing step in which a plurality of semiconductor chips 1 are mounted on and fixed to predetermined positions on the upper surface of the starting substrate 2A. The method also includes a connection step in which electrodes of the semiconductor chips 1 and corresponding electrodes of the starting substrate 2A are connected to each other by the wires 3, respectively. The method further includes a sealing process in which the entire lateral circumference of each semiconductor chip 1 is sealed with a resin by means of resin potting among the semiconductor chips 1 on the upper surface of the starting substrate 2A. The method includes a bonding step in which a sheet of the protective cover 5A is bonded to the upper surface of the resin 4 so that the protective cover 5A extends over the plurality of the semiconductor chips 1. The method further includes a cutting step in which the assembly of the semiconductor devices, which is obtained by bonding the protective cover 5A to the starting substrate 2A with the resin 4 therebetween, is cut to separate semiconductor devices 10. The protective cover 5 is bonded to the upper surface of the resin 4 that seals the entire lateral circumference of the semiconductor chip 1 so that a space SP, in which a portion of the wire 3 is exposed, is formed between the upper surface of the semiconductor chip 1 and the inner surface of the protective cover 5A.

The bonding step includes a pressing step. In the pressing step, the protective cover 5A is pressed against the upper surface of the resin 4 in a semi-cured state. In this case, the sum of the thickness of the protective cover 5A and the thickness of the resin 4 after curing is set greater than the distance from the upper surface of the starting substrate 2A to the highest position of the wire 3.

According to the method for manufacturing a semiconductor device and the semiconductor device according to Embodiment 1 have the following operations and advantageous effects as described below.

(1) Semiconductor devices having a hollow construction can be fabricated without preparing any substrate or lid member that is provided with concave portions. This enables a reduction in cost.

(2) Because it is unnecessary to form any mound portion in the substrate or the lid member, which is provided with the concave portions, the semiconductor device can be made much smaller than ever.

The semiconductor device according to the above-described Embodiment 1 may be modified as follows.

(1) The semiconductor device 10 may fabricated by using an optical element for the semiconductor chip and using a transparent resin or glass instead of the protective cover 5 to form an optical semiconductor device.

(2) In Embodiment 1 above, the protective cover 5A is pressed against the resin 4 in a semi-cured state. However, if the resin 4 has moderate viscosity from the start, the cover 5A may be bonded to the resin 4 before the resin 4 is semi-cured, that is, subsequent to potting of the resin 4. The resin 4 in a semi-cured state has consistency and adhesion that vary depending on the heating temperature and heating time from the uncured state of the resin and further the resin to be used. The pressing force exerted to the cover 5A upon bonding is set as appropriate depending on the consistency of the resin 4 and so as to disallow the pressed cover 5A to contact the bonding wire 3 to deform or damage it, or to disallow the pressed uncured resin 4 to migrate onto the semiconductor chip 1.

(3) If the curing of the resin 4 proceeds to cause a reduction in the adhesion of the surface of the resin 4, further heating upon pressing the protective cover 5A enables the surface of the resin 4 to soften so as to provide some adhesion unless the resin 4 is cured completely. The adhesion of the surface of the resin depends on the characteristics of and the cured state of the resin to be used. Accordingly, the pressing force and temperature at the time of attachment of the protective cover 5A are set in accordance with the resin and its cured state.

As explained above, the cover 5A is bonded making use of the adhesion of the resin 4 in a semi-cured state. In addition, semi-curing of the resin 4 has the following effects.

Semi-curing of the resin 4 enables the resin 4 to have a shape stabilized to some extent, so that it can be treated with ease.

The resin 4 may sometimes discharge gas containing an organic component or components. Heating the resin 4 to some extent for semi-curing it promotes the discharge of the gas. Bonding the cover 5A after the gas is sufficiently discharged by the heating eliminates breakage of the cover caused by an increase in pressure as a result of accumulation of the gas discharged from the resin 4 in the sealed hollow portion (space SP).

The discharged gas contains an organic component or components. If the organic component or components attach to a sensor mounted on the semiconductor chip 1, the characteristics of the sensor may be influenced depending on the type of sensor. However, bonding the cover 5A to the resin 4 in a semi-cured state after the gas is sufficiently discharged eliminates influences of the discharged gas to the sensor.

In case the resin discharges a relatively small amount of gas depending on the type of the resin or in case the protective cover 5 is provided with an opening as in Embodiments 4 to 11 described later, the discharge gas from the resin causes no problem.

Embodiment 2

Figure 4:
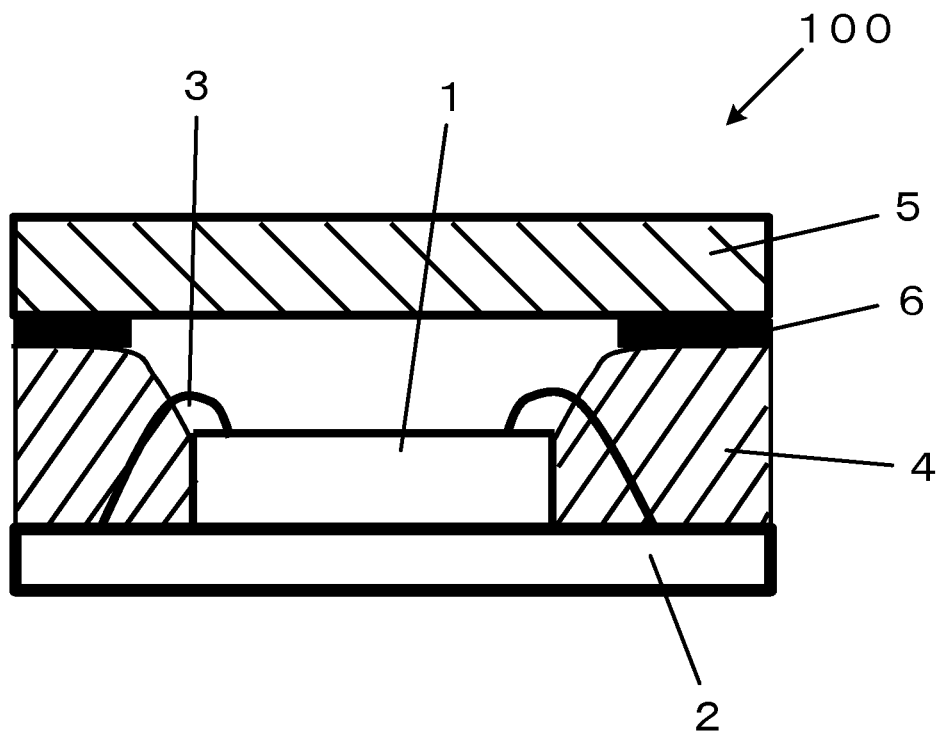
FIG. 4 is a cross-sectional view corresponding to a cross-section along the line II-II in FIG. 1, showing a semiconductor device according to Embodiment 2 of the present invention.

FIG. 4 is a cross-sectional view of the semiconductor device 100 according to Embodiment 2. FIG. 4 is a diagram corresponding to the cross-section along the line II-II in FIG. 1. In Embodiment 1, the protective cover 5A is bonded to the surface of the resin 4 by pressing the protective cover 5A against the surface of the resin 4 in a semi-cured state and then curing the resin 4. In contrast, in Embodiment 2, the protective cover 5A is bonded to the surface of the resin 4 that is in a completely cured state with the adhesive 6. The adhesive 6 may be an epoxy-based adhesive. However, it is not limited to a particular one as far as it can bond the resin 4 and the protective cover 5A made of a thin-film resin to each other.

FIGS. 5(a) and (b) show the method for manufacturing a semiconductor device according to Embodiment 2 of the present invention.

Figure 5:
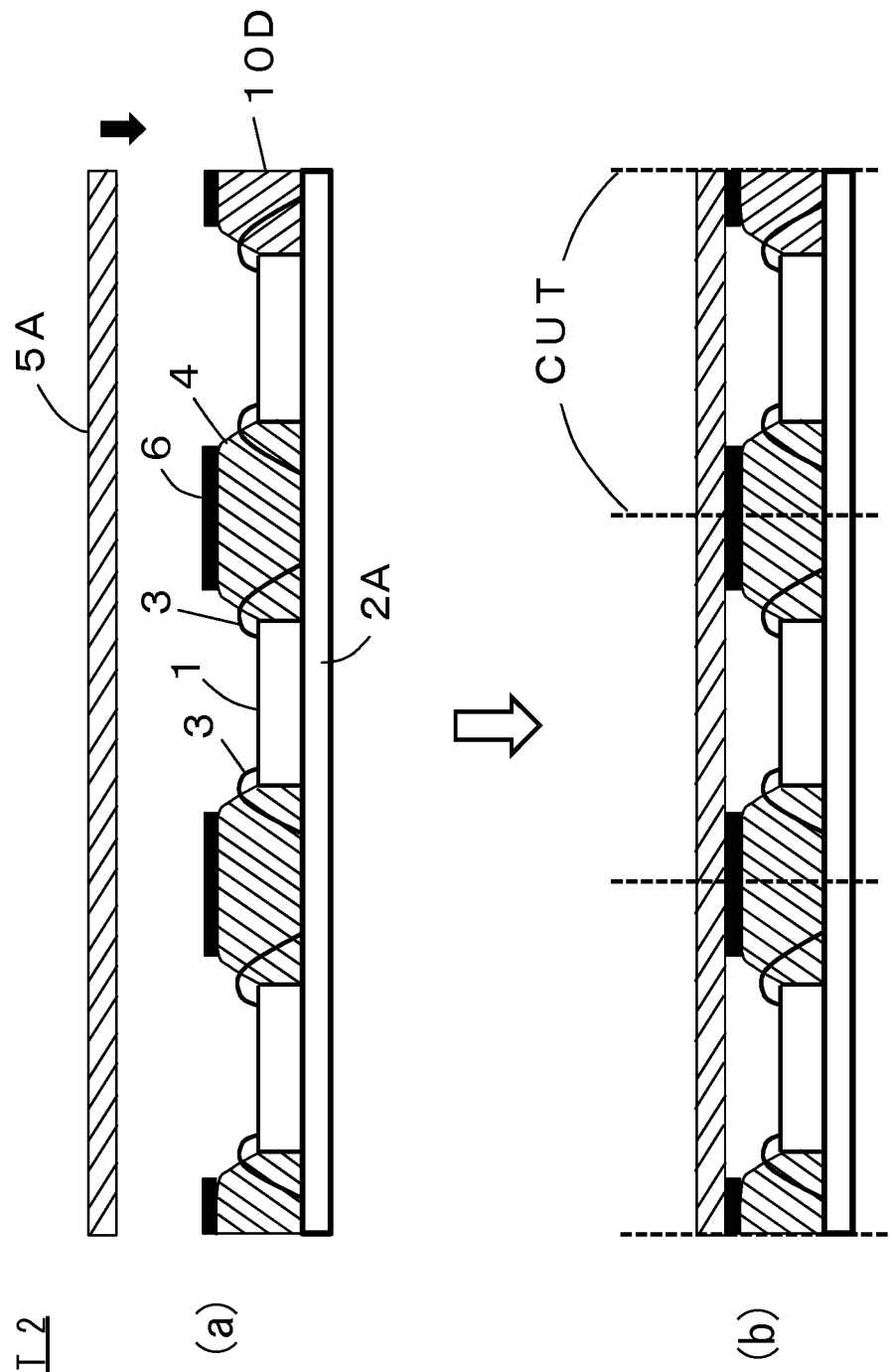
FIGS. 5(*a*) to (*b*) are diagrams illustrating Embodiment 2, which is a method for manufacturing the semiconductor device shown in FIG. 4.

FIG. 5 (a) shows an interim product 10D obtained by curing the resin 4 in a semi-cured state of the interim product 10B shown in FIG. 3 (c). The adhesive 6 is coated to the surface of the resin 4 of the interim product 10D and then the protective cover 5A is bonded to the surface of the resin 4 (FIG. 5 (a)). After the adhesive 6 is completely cured and the protective cover 5A is bonded to the resin 4, a plurality of semiconductor devices 10 arranged in the form of a matrix on the starting substrate 2A are cut into separate semiconductor devices 10 (FIG. 5 (b)) to obtain the semiconductor device 10 shown in FIG. 4.

In the method for manufacturing a semiconductor device according to Embodiment 2, the sealing step includes potting the resin 4 to a height that is larger than the height of the highest position of the wires 3 around the semiconductor chip 1. The manufacturing method includes a curing step in which the resin 4 is cured and a coating step in which the adhesive 6 is coated on the surface of the cured resin 4. In the bonding step, the protective cover 5 is bonded to the surface of the cured resin 4 with the adhesive 6.

Embodiment 2 also exhibits the same operations and advantageous effects as those obtained in Embodiment 1.

Embodiment 3

FIGS. 6(a) to (c) illustrate the method for manufacturing a semiconductor device according to Embodiment 3 of the present invention. The semiconductor device 10 fabricated according to Embodiment 3 is the one shown in FIGS. 1 and 2.

Figure 6:
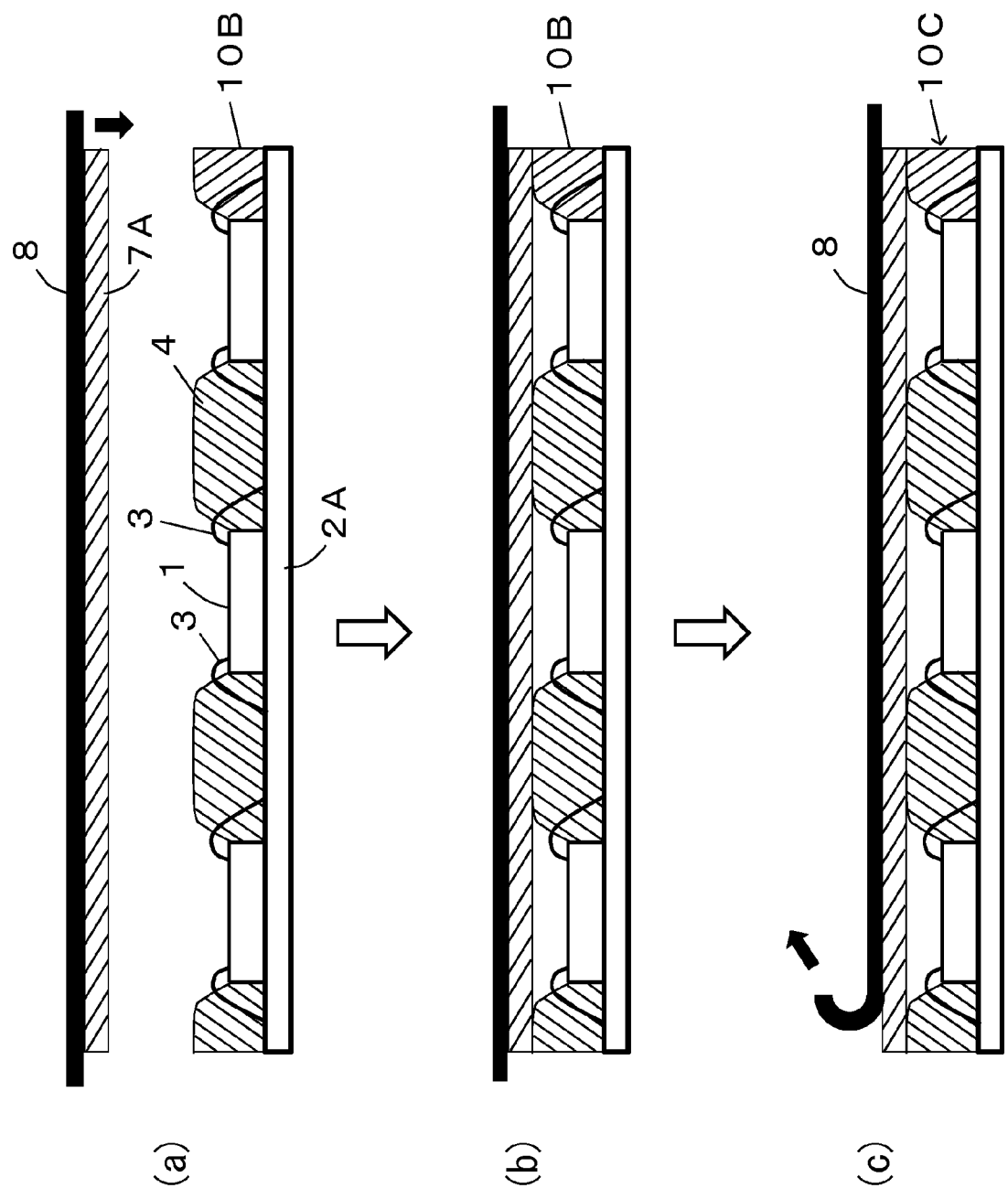
FIGS. 6 (*a*) to (*c*) are diagrams illustrating Embodiment 3, which is a method for manufacturing the semiconductor device shown in FIG. 1.

FIG. 6(a) shows the interim product 10B shown in FIG. 3 (c), which includes the resin 4 in a semi-cured state. The thermosetting resin is applied to a flexible support sheet 8 made of, for instance, metal to form a resin layer 7A. While the resin layer 7A is in a semi-cured state, the support sheet 8 with the resin layer 7A being down side is attached to the resin 4 of the interim product 10B from above through the resin layer 7A as shown in FIGS. 6 (a) and (b).

After the resin layer 7A is bonded and completely cured, the support sheet 8 is peeled off (FIG. 6 (c)). As a result, the interim product 10C, which is similar to that shown in FIG. 3 (d), is obtained. The obtained interim product 10C is cut to fabricate separate semiconductor devices 10.

The support sheet 8 used has a surface irregularity on the order of 10 μm or less. The reason for this is as follows. That is, the flatter the surface of the support sheet 8 is, the more easily is released the resin layer 7A.

In the method for manufacturing a semiconductor device according to Embodiment 3, the sealing step is achieved by potting the resin 4 to a height that is larger than the height of the highest position of the wires 3 around the semiconductor chip 1. This method further includes a coating step in which the resin layer 7A, which forms the protective cover 5, is coated to the support sheet 8; a pressing step in which the support sheet 8 is pressed onto the upper surface of the resin 4 in a semi-cured state via the resin layer 7A; and a peeling/forming step in which after the resin layer 7A and the resin 4 are cured, the support sheet 8 is peeled off to form a protective cover on the upper surface of the resin layer 7A. The sum of the thickness of the protective cover and the thickness of the resin 4 after the peeling/forming step is set to be larger than the distance from the upper surface of the starting substrate 2A to the highest position of the wire 3. Thereafter, the assembly of the semiconductor devices is cut to separate semiconductor devices.

Embodiment 3 can exhibit the same operations and advantageous effects as those exhibited in Embodiment 1.

By the method according to Embodiment 3, both the resin 4 and the resin layer 7A are bonded to each other while they are in a semi-cured state. This enables the interface between the resin 4 and the resin layer 7A to become a relatively uniform layer. The advantage of the interface between the resin 4 and the resin layer 7A being a relatively uniform layer is that use of the same material provides strong bonding and higher moisture resistance than the bonding achieved by use of different materials.

Variation Example 1 of Embodiment 3

In Embodiment 3, the resin layer 7A that is in a semi-cured state is pressed against the surface of the resin 4 being in a semi-cured state. However, the resin layer 7A in a semi-cured state may be attached to the resin 4 in a cured state.

Variation Example 2 of Embodiment 3

In Embodiment 3, the resin layer 7A in a semi-cured state is pressed against the resin 4 of the interim product 10B. However, due to, for instance, the viscosity of the resin layer 7A, sufficiently decreased pressing force enables the resin layer 7A to be bonded as it is in an uncured state. Further, as explained about Embodiment 1, it is possible to achieve bonding even if the resin 4 is in an uncured state.

If the resin layer 7A is uncured, any contact with the bonding wire 3 causes no deformation of the bonding wire 3 because the resin layer 7A is deformed.

Embodiment 4

Figure 7:
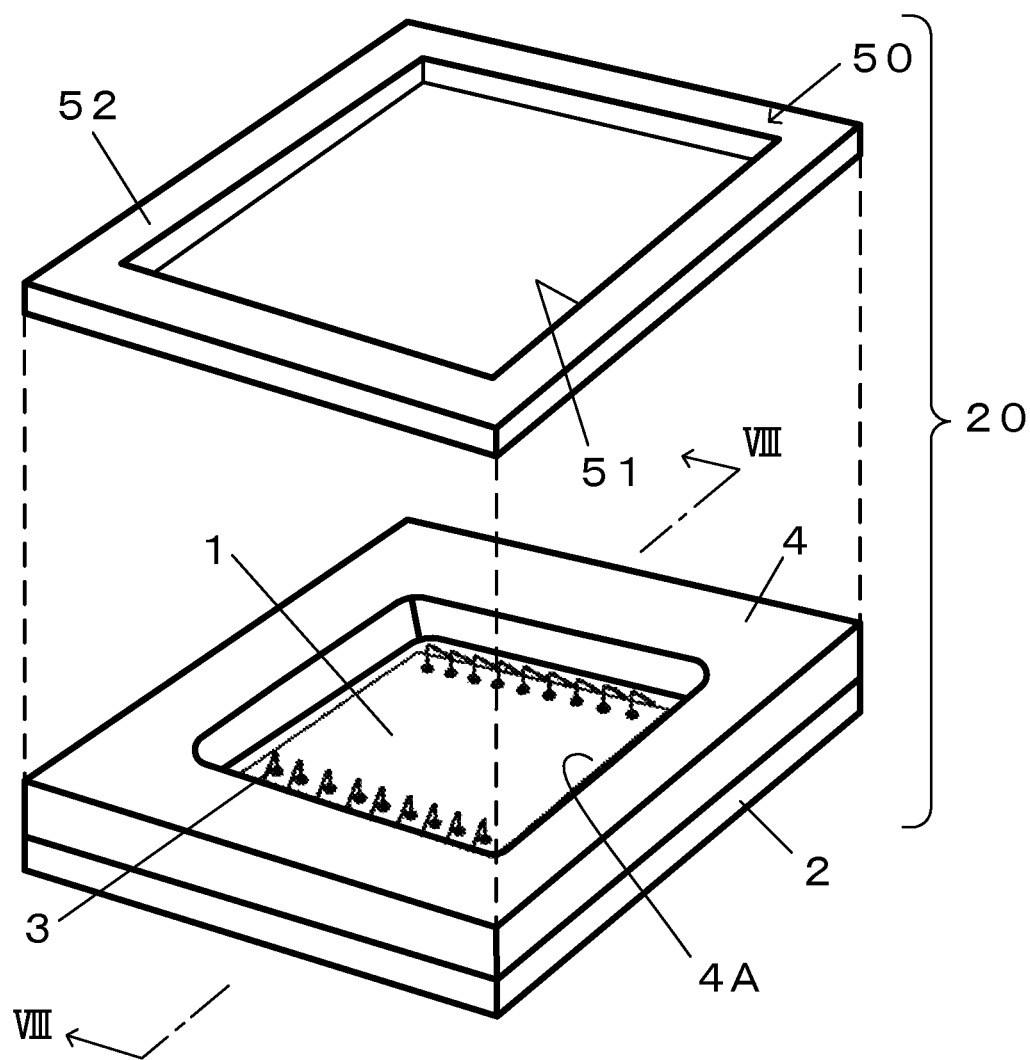
FIG. 7 is an exploded perspective view showing a semiconductor device according to Embodiment 4 of the present invention.
Figure 8:
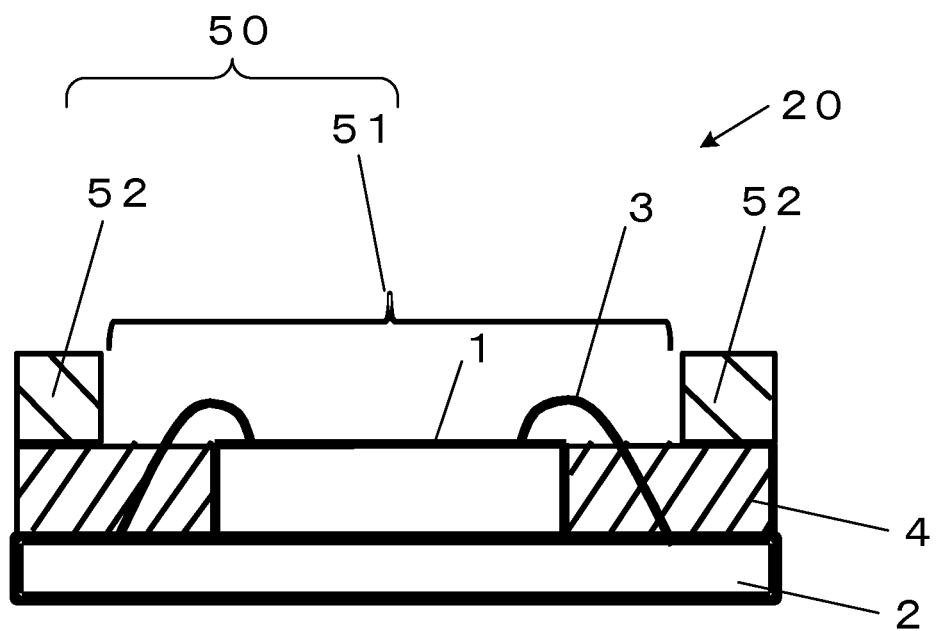
FIG. 8 is a cross-sectional view along the line VIII-VIII in FIG. 7.

FIG. 7 is an outline view of the semiconductor device 20 according to Embodiment 4 and FIG. 8 is a cross-sectional view along the line VIII-VIII in FIG. 7. The semiconductor device 20 includes the semiconductor chip 1 installed on the upper surface of the substrate 2, the resin 4 that seals the semiconductor chip 1, and a cover 50 that covers the surface of the resin 4 that seals. The semiconductor chip 1 is a chip of an optical element such as a photodiode (PD) or a light-emitting diode (LED). The resin 4 has an opening 4A. The cover 50 is a sheet-like flat plate that has an opening 51 larger than the planar-view shape of the semiconductor chip 1.

Figure 9:
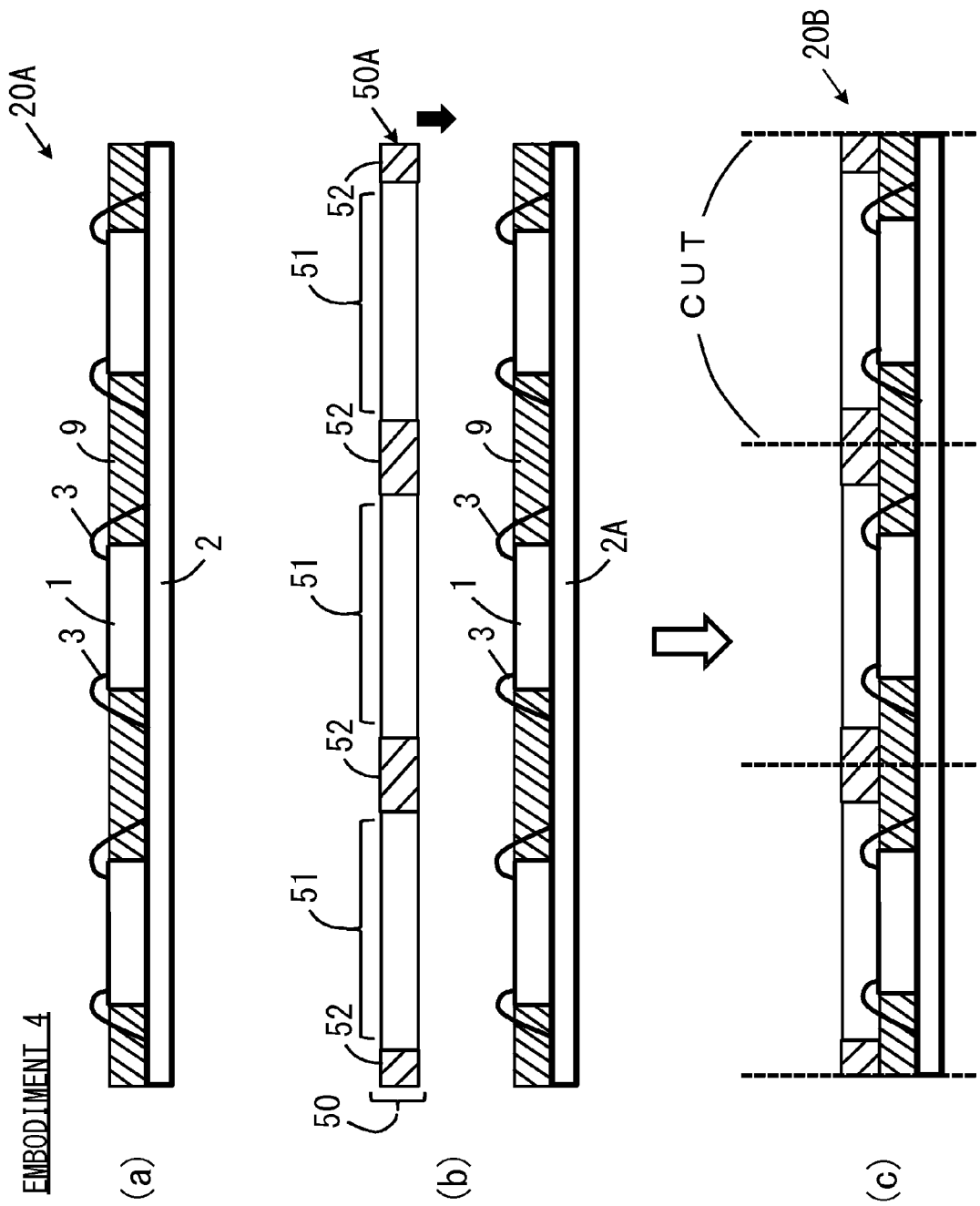
FIGS. 9(*a*) to (*c*) are diagrams illustrating Embodiment 4, which is a method for manufacturing the semiconductor device shown in FIG. 7.

FIGS. 9 (a) to (c) illustrate the method for manufacturing a semiconductor device according to Embodiment 4 of the present invention.

In Embodiment 1 to 3 above, the protective cover 5 that is made of a sheet resin and covers the entire upper surface of the semiconductor chip 1 is used. In Embodiment 4, the semiconductor device 20 includes the protective cover 50 provided with an opening 51 and a frame 52 instead of the protective cover 5. In Embodiment 4, the semiconductor device 20 is configured to eliminate covering the opening of the semiconductor chip 1 by the protective cover 50.

In Embodiment 4, a resin 9 is provided by potting between any adjacent two semiconductor chips 1 to have a height about the same as the height of the semiconductor chips 1. The resin 9 used is a thermosetting resin, for instance, epoxy resin similarly to Embodiment 1. The potted resin 9 is heated at a temperature equal to or higher than the curing-start temperature for a predetermined time, which renders the resin semi-cured to obtain an interim product 20A shown in FIG. 9(a).

Next, a protective cover 50A made of a sheet resin having an opening 51 larger than the semiconductor chip 1 is pressed against the resin 9 from above (FIG. 9 (b)). Thereafter, the resin 9 is completely cured by heating (FIG. 9 (c)). In this case the heating conditions are the same as those in Embodiments 1 to 3. The thickness of the protective cover 50A is set so that the upper surface of a frame 52 is higher than the height of the highest position of the bonding wire 3. The opening 51 is set to be large enough to eliminate contact by the bonding wires 3.

FIG. 9(c) shows an interim product 20B obtained by completely curing the resin 9 in a state in which the protective cover 50A made of a sheet resin is bonded to it. The interim product 20B is cut into individual pieces along cutting lines to obtain the semiconductor device 20 as shown in FIG. 7 and FIG. 8. The semiconductor device 20 having such a structure can be mounted on, for instance, a larger printed circuit board (PCB) without contacting the bonding wires 3.

The PCB on which the semiconductor devices 20 of this type are mounted is commonly sealed in whole with another cover to protect the semiconductor chips of the semiconductor devices.

In Embodiment 4, the resin 9 is provided by potting to the height about the same as the height of the semiconductor chip 1. However, as can be seen from FIG. 9(c), if the sum of the height of the resin 9 and the thickness of the sheet-resin-made cover 50A, that is, the thickness of the frame 52 is larger than the distance from the upper surface of the substrate to the highest position of the bonding wire 3, each semiconductor device can be mounted without contacting the bonding wires 3. Accordingly, the height of the resin 9 may be different from the height of the semiconductor chip 1.

In the method for manufacturing a semiconductor device according to Embodiment 4, the sealing step is achieved by potting the resin 9 to the height nearly (substantially) the same as the height of the upper surface of the semiconductor chip 1 around the semiconductor chip 1. The single protective cover 50A has an opening 51 large enough to surround a plurality of wires connected to a plurality of corresponding electrodes of the starting substrate 2A. The sum of the thickness of the protective cover 50 and the thickness of the resin 9 is set to be larger than the distance from the upper surface of the starting substrate 2A to the highest position of the wires 3. While the resin 9 is in a semi-cured state, the protective cover 50A is pressed against the resin 9 to bond it. Thereafter, the resultant structure is individualized to obtain each semiconductor device.

Embodiment 4 also exhibits operations and advantageous effects similar to those in Embodiment 1.

Embodiment 5

Figure 10:
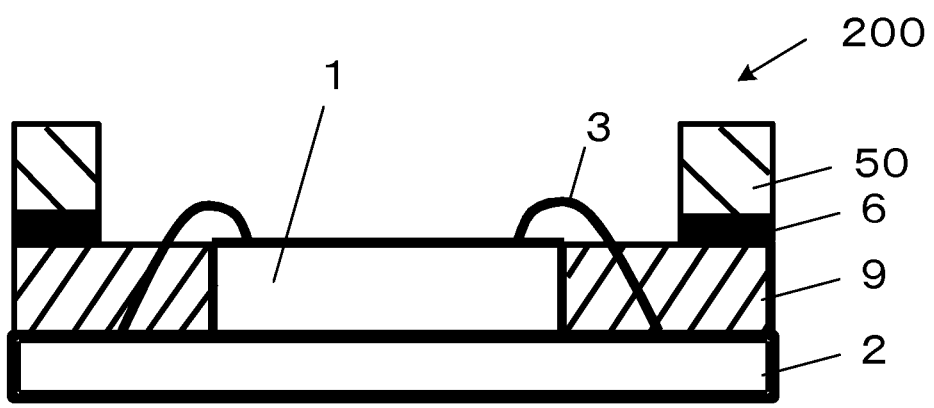
FIG. 10 is a cross-sectional view corresponding to the cross-section along the line VIII-VIII in FIG. 7, showing a semiconductor device according to Embodiment 5 of the present invention.

Like the semiconductor device 200 shown in FIG. 10, the single large protective cover 50A (see FIG. 9 (b)) for fabricating the sheet-resin-made cover 50 described in Embodiment 5 may be bonded to the resin 9 by coating the adhesive 6 on the resin 9 in the same manner as that in Embodiment 2 (see FIG. 4). Since the sheet-resin-made cover 50 is cured, the bonding may be achieved by coating the adhesive on the side of the sheet-resin-made cover 50 instead of the resin 9 and pressing the coated side of the sheet-resin-made cover 50 against the resin 9.

In the method for manufacturing a semiconductor device according to Embodiment 5, the sealing step is achieved by potting the resin 9 to a height position nearly the same as the height of the upper surface of the semiconductor chip 1 around the semiconductor chip 1. The protective cover 50A has an opening 51 large enough to surround the wires 3 connected to the corresponding electrodes of the starting substrate 2A. The sum of the thickness of the protective cover 50A and the thickness of the resin 9 is set to be larger than the distance from the upper surface of the starting substrate 2A to the highest position of the wires 3. After the resin 9 is cured, the protective cover 50A is bonded to the resin 9 with the adhesive 6.

Embodiment 5 also exhibits similar operations and advantageous effects to those in Embodiment 1.

Embodiment 6

Figure 11:
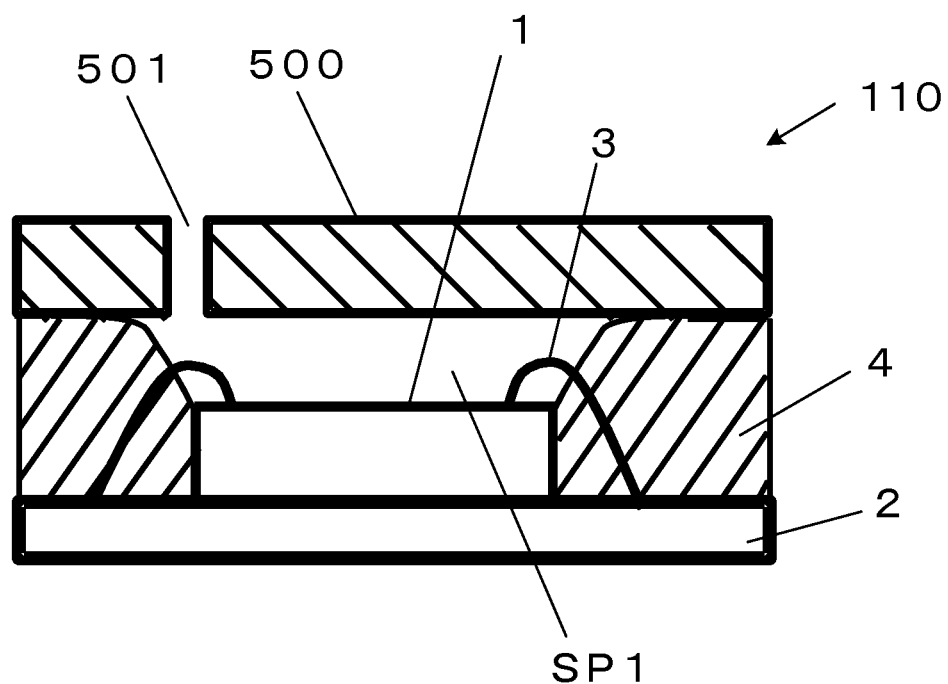
FIG. 11 is a cross-sectional view corresponding to a cross-section along the line VIII-VIII of FIG. 7, showing a semiconductor device according to Embodiment 6 of the present invention.

FIG. 11 is a cross-sectional view of the semiconductor device 110 according to Embodiment 6. FIG. 11 is a diagram corresponding to a cross-sectional view along the lines II-II in FIG. 1. In Embodiment 6, a space SP1 is formed by arranging a protective cover 500 above the semiconductor chip 1. In Embodiment 6, the cover 500 of the semiconductor device 110 is provided with an opening 501. The opening 501 is a small opening having a size of, for instance, 1 mm or less.

The semiconductor device 110 having such a structure is suitable for use in such a manner as that in which the semiconductor chip 1 is exposed to external air. This is the case, for instance, if the semiconductor chip 1 is equipped with a functional element for detecting, for instance, gas or sound.

The size of the opening 501 in the protective cover 500 may be varied as appropriate depending on the specification of the semiconductor device.

Embodiment 6 also exhibits similar operations and advantageous effects to those in Embodiment 1.

Figure 12:
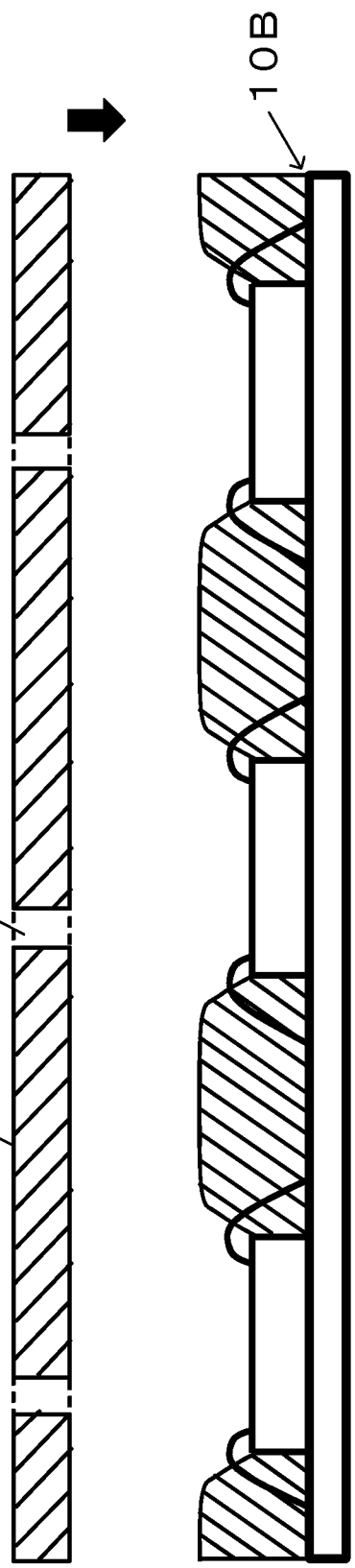
FIG. 12 is a diagram illustrating Embodiment 6, which is a method for manufacturing the semiconductor device shown in FIG. 11.

FIG. 12 is a diagram illustrating method for manufacturing a semiconductor device according to Embodiment 6.

As shown in FIG. 12, a sheet-resin-made protective cover 500A provided with the opening 501 smaller than the opening 51 in the protective cover 50A shown in FIG. 9(b) is pressed against the surface of the resin 4 in a semi-cured state in the interim product 10B shown in FIG. 3(c) to bond it.

Embodiment 6 also exhibits similar operations and advantageous effects to those in Embodiment 1.

Embodiment 7

Figure 13:
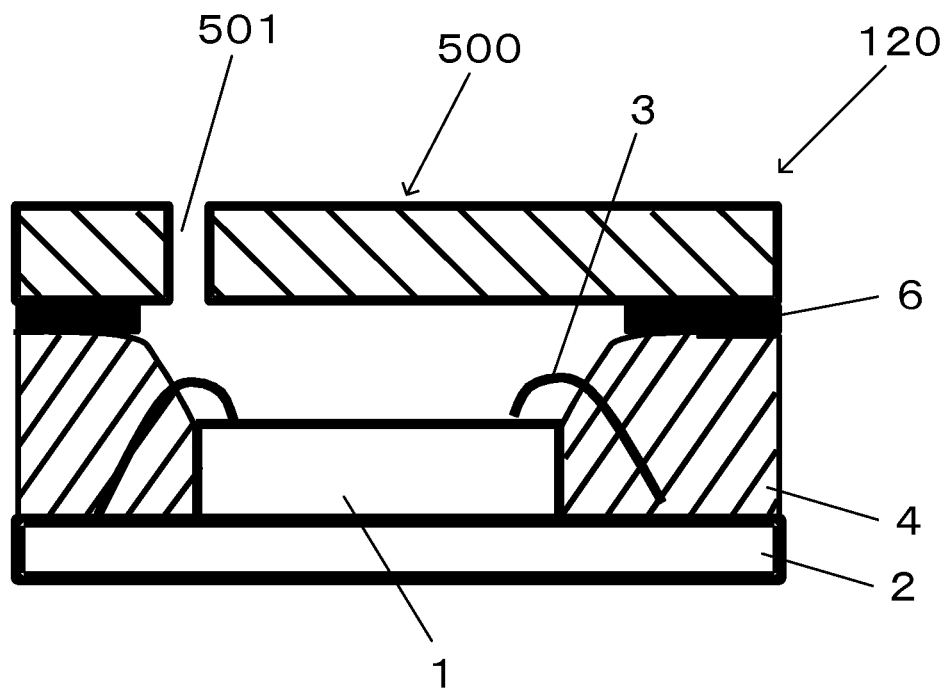
FIG. 13 is a cross-sectional view corresponding to a cross-section along the line VIII-VIII in FIG. 7, showing a semiconductor device according to Embodiment 7 of the present invention.

FIG. 13 is a cross-sectional view showing a semiconductor device 120 according to Embodiment 7, corresponding to a cross-section along the line VIII-VIII in FIG. 7. The protective cover 500 with the opening 501 is bonded onto the upper surface of the cured resin 4 with the adhesive 6.

Embodiment 8

Figure 14:
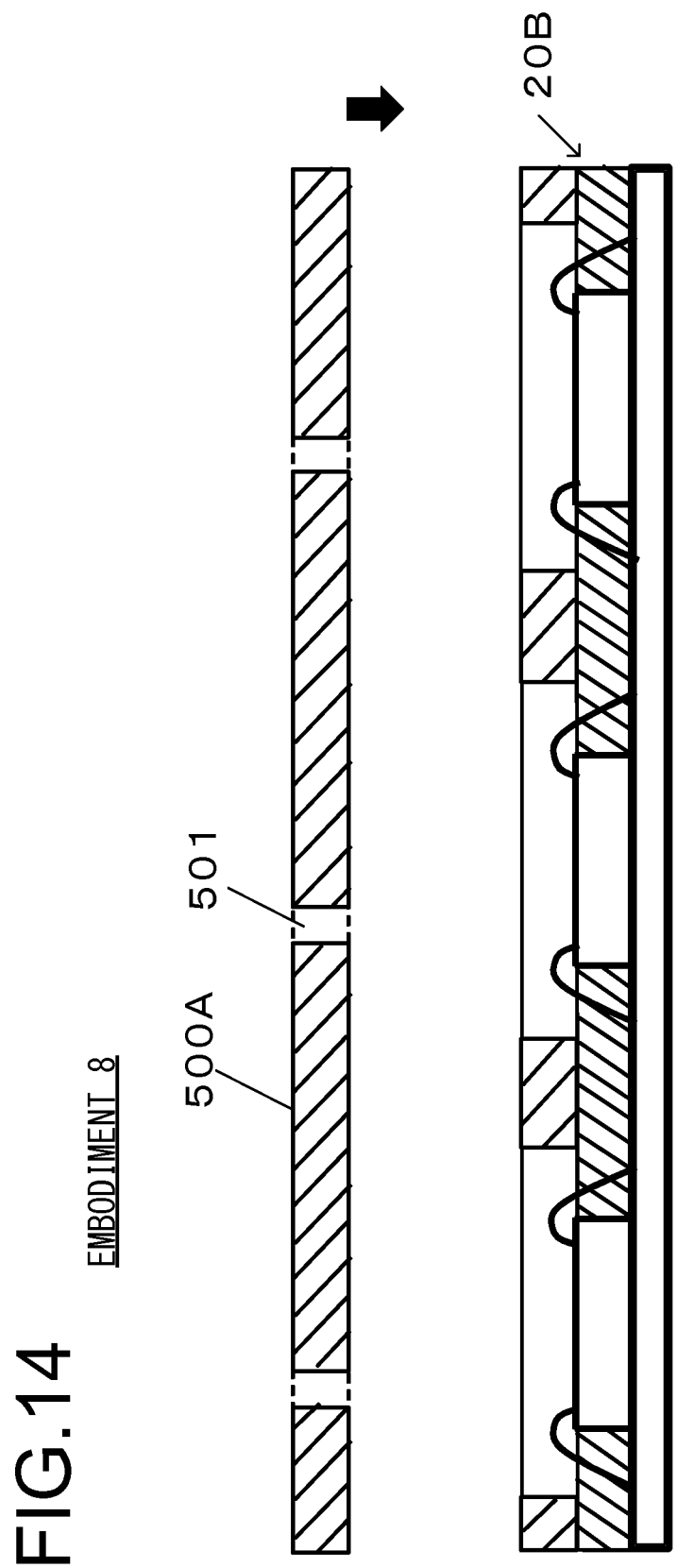
FIG. 14 is a diagram illustrating Embodiment 8, which is a method for manufacturing another semiconductor device.

FIG. 14 is a diagram illustrating the method for manufacturing a semiconductor device according to Embodiment 8. According to this embodiment, the protective cover 500A, which is provided with the opening 501 that is smaller than the opening 51 in the protective cover 50 in FIG. 9 (b), is bonded to the interim product 20B (see FIG. 9 (c)) according to Embodiment 4. The protective cover 500A may be bonded to the frame 52 with an adhesive.

Alternatively, though not shown, the frame 52 may further be potted with a resin and while the potted resin is in a semi-cured or uncured state, the protective cover 500A may be pressed against the frame 52 to bond it.

Embodiments 9, 11

FIG. 15(a) is a cross-sectional view showing a semiconductor device 300 according to Embodiment 9, corresponding to the cross-section along the line VIII-VIII in FIG. 7.

FIG. 15(b) is a cross-sectional view showing a semiconductor device 310 according to Embodiment 10, corresponding to a cross-section along the line VIII-VIII in FIG. 7.

The semiconductor devices 300 and 310 use a cover 550 that covers upside of the bonding wires 3 and is provided with an opening 551 being large enough to uncover upside of the element mounted in the semiconductor chip 1.

The semiconductor device 300 according to Embodiment 9 shown in FIG. 15 (a) is fabricated by pressing the protective cover 550 made of a resin sheet to the surface of the resin 4 in a semi-cured state to bond it.

The semiconductor device 310 according to Embodiment 10 shown in FIG. 15(b) is fabricated by bonding the protective cover 550 made of a resin sheet to the upper surface of the cured resin 4 with the adhesive 6.

Embodiment 11

Figure 16:
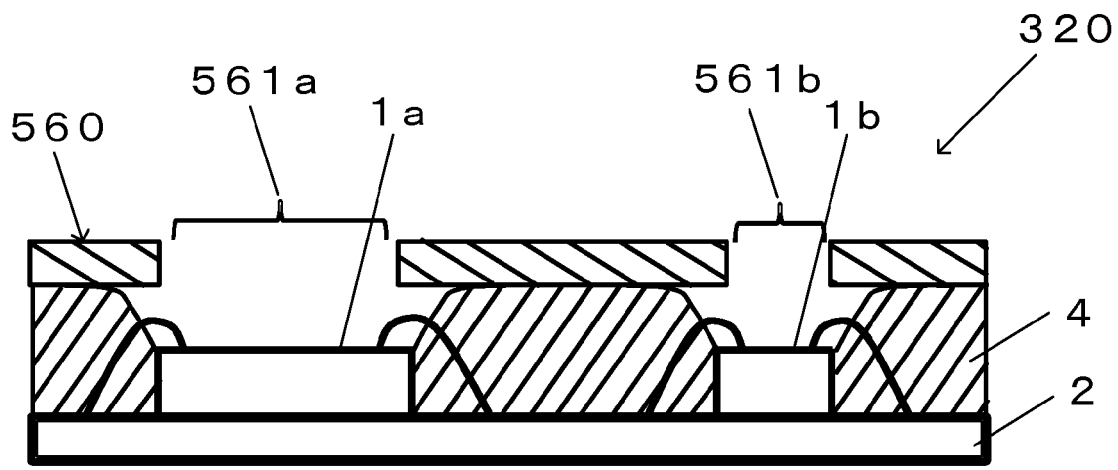
FIG. 16 is a cross-sectional view corresponding to the cross-section along the line VIII-VIII in FIG. 7, showing a semiconductor device according to Embodiment 11 of the present invention.

FIG. 16 is a cross-sectional view showing a semiconductor device 320 according to Embodiment 11, corresponding to the cross-section along the line VIII-VIII in FIG. 7. The semiconductor device 320 includes, mounted on the upper surface of the substrate 2, two semiconductor chips 1a and 1b having different functions from each other. A protective cover 560 for these semiconductor chips are each provided with an opening 561a that opens upside of the functional element or semiconductor chip 1a and an opening 561ba that opens upside of the functional element or semiconductor chip 1b, respectively.

The above explanations relate to exemplary embodiments of the present invention and the present invention is not limited to these embodiments and variation examples. It is possible for a person skilled in the art to combine the embodiments and variation examples in any desired manner without damaging the features of the present invention and practice the present invention in various modified manner.

For instance, the sealed structure in Embodiment 1 can be adopted in semiconductor chips on which one or more optical elements such as a photodiode (PD) and a light-emitting diode (LED) are mounted or in semiconductor chips including an erasable programmable read only memory (EPROM). In this case, naturally a plate made of a transparent resin or a glass plate is used as the cover 5A.

In Embodiments 1 to 11 described above, explanation is made taking a thermosetting resin as an example of the resin 4 used. However, the present invention is not limited to it and materials other than the thermosetting resin may be used as the resin 4. For instance, an ultraviolet curable resin may be used as the resin 4.

In Embodiments 1 to 11, explanation is made on the example in which after the bonding step to bond the protective cover 5A, 50A, or 500A to the upper surface of the resin 4 so as to extend over a plurality of semiconductor chips 1, the cutting step is performed to cut the starting substrate 2A, to which the single protective cover 5A, 50A, or 500A is bonded through the resin 4, into separate semiconductor devices. However, the method for manufacturing a semiconductor device according to the present invention is not limited to this. For instance, the starting substrate 2 obtained by installing a plurality of semiconductor chips 1 and sealing them with the resin may be individualized by cutting the obtained structure in correspondence to individual semiconductor devices and then bonding the sheet-resin-made protective cover 5, 50, 500, 550, or 560 to the resin 4 of each of the resultant individual semiconductor devices. Specifically, after the resin 4 is provided on the starting substrate 2 by potting, the resultant starting substrate 2 is cut into pieces in correspondence to the individual semiconductor devices. Thereafter, the protective cover 5 is bonded onto the surface of the resin 4 with the adhesive 6.

The disclosure of the following priority application is incorporated herein by reference:

Japanese Patent Application No. 2013-94349 (filed on Apr. 26, 2013).

REFERENCE SIGNS LIST 1, 1a, 1b . . . semiconductor chip
2 . . . substrate
2A . . . starting substrate
3 . . . bonding wire
4 . . . resin
5, 50, 500, 550, 560 . . . sheet-resin-made cover
5A, 50A, 500A . . . single large protective cover
6 . . . adhesive
7A . . . resin layer
8 . . . support sheet
9 . . . resin
51, 501, 551, 561a, 561b . . . opening
52 . . . frame
10, 20, 100, 110, 120, 200, 300, 310, 320 . . . semiconductor device

The invention claimed is:

1. A method for manufacturing a semiconductor device including a substrate, a semiconductor chip mounted on the substrate having a functional element, a resin that seals a circumference of the semiconductor chip, and a flat plate-like protective cover bonded to an upper surface of the resin, the method comprising:

a fixing step in which a plurality of semiconductor chips each corresponding to the semiconductor chip in the semiconductor device are mounted on and fixed to predetermined positions on an upper surface of a single starting substrate that is to form individual pieces each corresponding to the substrate in the semiconductor device;

a connection step in which electrodes of the plurality of semiconductor chips and corresponding electrodes of the starting substrate are connected by wires, respectively;

a sealing step in which on the upper surface of the starting substrate, the resin with thermosetting is provided by potting among the plurality of semiconductor chips to seal the semiconductor chips with the resin over an entire lateral circumference of each of the semiconductor chip, so that a height of the resin is larger than a highest position of the wires around each semiconductor chip;

a semi-curing step to bring the resin into a semi-cured state by heating the resin;

a bonding step in which a single starting protective cover that is to form individual pieces each corresponding to the protective cover is bonded to a surface of the resin so as to extend over the plurality of semiconductor chips;

a curing step to cure the resin to which the starting protective cover is bonded; and a cutting step in which an assembly of the semiconductor devices formed by bonding the starting protective cover to the starting substrate via the resin is cut to pieces each corresponding to the semiconductor device, wherein in the bonding step, the starting protective cover is bonded to the upper surface of the resin that seals the entire lateral circumference of each semiconductor chip so that a space in which each of the wires is partially exposed is formed between an upper surface of each semiconductor chip and an inner surface of the starting protective cover.

2. A method for manufacturing a semiconductor device including a substrate, a semiconductor chip mounted on the substrate having a functional element, a resin that seals a circumference of the semiconductor chip, and a flat plate-like protective cover bonded to an upper surface of the resin, the method comprising:

a fixing step in which a plurality of semiconductor chips each corresponding to the semiconductor chip in the semiconductor device are mounted on and fixed to predetermined positions on an upper surface of a single starting substrate that is to form individual pieces each corresponding to the substrate in semiconductor device;

a connection step in which electrodes of the plurality of semiconductor chips and corresponding electrodes of the starting substrate are connected by wires, respectively;

a sealing step in which on the upper surface of the starting substrate, the resin with thermosetting is provided by potting among the plurality of semiconductor chips to seal the semiconductor chips with the resin over an entire lateral circumference of each of the semiconductor chips, so that a height of the resin is larger than a highest position of the wires around each semiconductor chip;

a curing step to cure the resin;

a coating step in which an adhesive is coated on the surface of the cured resin;

a bonding step in which a single starting protective cover that is to form individual pieces each corresponding to the protective cover is bonded to a surface of the resin so as to extend over the plurality of semiconductor chips; and a cutting step in which an assembly of the semiconductor devices formed by bonding the starting protective cover to the starting substrate via the resin is cut to pieces each corresponding to the semiconductor device, wherein in the bonding step, the starting protective cover is bonded to the upper surface of the resin that seals the entire lateral circumference of each semiconductor chip so that a space in which each of the wires is partially exposed is formed between an upper surface of each semiconductor chip and an inner surface of the starting protective cover.

3. A method for manufacturing a semiconductor device including a substrate, a semiconductor chip mounted on the substrate having a functional element, a resin that seals a circumference of the semiconductor chip, and a flat plate-like protective cover bonded to an upper surface of the resin, the method comprising:

a fixing step in which a plurality of semiconductor chips each corresponding to the semiconductor chip in the semiconductor device are mounted on and fixed to predetermined positions on an upper surface of a single starting substrate that is to form individual pieces each corresponding to the substrate in semiconductor device;

a connection step in which electrodes of the plurality of semiconductor chips and corresponding electrodes of the starting substrate are connected by wires, respectively;

a sealing step in which on the upper surface of the starting substrate, the resin is provided by potting among the plurality of semiconductor chips to seal the semiconductor chips with the resin over an entire lateral circumference of each of semiconductor chip, so that a height of the resin is larger than a highest position of the wires around each semiconductor chip;

a coating step in which a resin layer that is to form individual pieces each corresponding to the protective cover for each semiconductor chip is coated on a support sheet;

a pressing step in which the support sheet is pressed against an upper surface of the resin in a semi-cured state or in an uncured state via the resin layer; and a peeling/forming step in which after the resin layer and the resin are cured, the support sheet is peeled off and a resin layer that is to form individual pieces each corresponding to the protective cover is bonded to an upper surface of the resin from which the support sheet is peeled off, wherein a sum of a thickness of the resin layer and a thickness of the resin after the peeling/forming step is made larger than a distance from an upper surface of the starting substrate to a highest position of the wire.

4. A method for manufacturing a semiconductor device including a substrate, a semiconductor chip mounted on the substrate having a functional element, a resin that seals a circumference of the semiconductor chip, and a flat plate-like protective cover bonded to an upper surface of the resin, the method comprising:

a fixing step in which a plurality of semiconductor chips each corresponding to the semiconductor chip in the semiconductor device are mounted on and fixed to predetermined positions on an upper surface of a single starting substrate that is to form individual pieces each corresponding to the substrate in the semiconductor device;

a connection step in which electrodes of the plurality of semiconductor chips and corresponding electrodes of the starting substrate are connected by wires, respectively;

a sealing step in which on the upper surface of the starting substrate, the resin is provided by potting among the plurality of semiconductor chips to seal the semiconductor chips with the resin over an entire lateral circumference of each of the semiconductor chip, so that a height of the resin is larger than a highest position of the wires around each semiconductor chip;

a semi-curing step to bring the resin into a semi-cured state;

a bonding step in which a single starting protective cover that is to form individual pieces each corresponding to the protective cover is bonded to a surface of the resin so as to extend over the plurality of semiconductor chips;

the protective cover having an opening facing opposite to a part of each of semiconductor chip fixed on the upper surface of the single starting substrate; and a cutting step in which an assembly of the semiconductor devices formed by bonding the starting protective cover to the starting substrate via the resin is cut to pieces each corresponding to the semiconductor device, wherein after the cutting step, the part of each semiconductor is exposed out of the opening of the protective cover.

5. A method for manufacturing a semiconductor device including a substrate, a semiconductor chip mounted on the substrate having a functional element, a resin that seals a circumference of the semiconductor chip, and a flat plate-like protective cover bonded to an upper surface of the resin, the method comprising:

a fixing step in which a plurality of semiconductor chips each corresponding to the semiconductor chip in the semiconductor device are mounted on and fixed to predetermined positions on an upper surface of a single starting substrate that is to form individual pieces each corresponding to the substrate in the semiconductor device;

a connection step in which electrodes of the plurality of semiconductor chips and corresponding electrodes of the starting substrate are connected by wires, respectively;

a sealing step in which at the upper surface of the starting substrate, the resin is provided by potting around each semiconductor chip to a height of the substantially upper surface of the semiconductor chip;

a frame member bonding step in which a frame member that has an opening large enough to surround the wires connected to the electrodes of the starting substrate is bonded on the resin; and a bonding step in which a single starting protective cover that is to form individual pieces each corresponding to the protective cover is bonded to a surface of the resin so as to extend over the plurality of semiconductor chips, the protective cover having an opening facing opposite to a part of each of semiconductor chip fixed on the upper surface of the single stating substrate, wherein
a sum of a thickness of the frame member and a thickness of the resin is made larger than a distance from the upper surface of the starting substrate to a highest position of the wires, and
after the cutting step, the part of each semiconductor is exposed out of the opening of the protective cover.

6. A semiconductor device, comprising:

a substrate;

a semiconductor chip that has a functional element and is mounted on the substrate, with electrodes of the functional element and corresponding electrodes of the substrate being connected to each other by wires, respectively;

a resin that is provided around the semiconductor chip to a position higher than height of a highest position of the wires to seal semiconductor chip; and a flat plate-like protective cover bonded to a surface of the resin and that has an opening facing opposite to a part of the semiconductor chip, wherein the protective cover is bonded to an upper surface of the resin that seals an entire circumference of the semiconductor chip so as to form a space in which the wires are partially exposed between the upper surface of the semiconductor chip and an inner surface of the protective cover, and the part of the semiconductor chip is exposed out of the opening of the protective cover.

* * * * *